US011331697B2

(12) United States Patent
Chien

(10) Patent No.: US 11,331,697 B2
(45) Date of Patent: May 17, 2022

(54) VIBRATION CLEANING DEVICE, METHOD AND SYSTEM

(71) Applicants: HKC Corporation Limited, Guangdong (CN); Chongqing HKC Optoelectronics Technology Co., Ltd., Chongqing (CN)

(72) Inventor: Chungkuang Chien, Chongqing (CN)

(73) Assignees: HKC CORPORATION LIMITED, Guangdong (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 42 days.

(21) Appl. No.: 16/612,122

(22) PCT Filed: Jul. 4, 2017

(86) PCT No.: PCT/CN2017/091645
§ 371 (c)(1),
(2) Date: Nov. 8, 2019

(87) PCT Pub. No.: WO2018/205397
PCT Pub. Date: Nov. 15, 2018

(65) Prior Publication Data

US 2020/0164411 A1 May 28, 2020

(30) Foreign Application Priority Data

May 11, 2017 (CN) ......................... 201710329210.9

(51) Int. Cl.
*B08B 1/00* (2006.01)
*B08B 3/12* (2006.01)
(Continued)

(52) U.S. Cl.
CPC .............. *B08B 3/123* (2013.01); *B08B 1/002* (2013.01); *B08B 3/022* (2013.01); *B08B 3/041* (2013.01); *B08B 3/08* (2013.01)

(58) Field of Classification Search
CPC ......... B08B 1/123; B08B 1/002; B08B 3/022; B08B 3/041; B08B 3/08
See application file for complete search history.

(56) References Cited

U.S. PATENT DOCUMENTS 5,975,094 A * 11/1999 Shurtliff ............ H01L 21/67046 134/1.3
6,110,294 A * 8/2000 Shipley ............ H01L 21/67046 134/1.3
(Continued)

FOREIGN PATENT DOCUMENTS

CN 1955848 A 5/2007
CN 101028624 A 9/2007
(Continued)

*Primary Examiner* — Sharidan Carrillo
(74) *Attorney, Agent, or Firm* — Muncy, Geissler, Olds & Lowe, P.C.

(57) ABSTRACT

A vibration cleaning device, method and system are provided. The vibration cleaning device includes a cleaning module configured to clean an object through a cleaning solution; a cleaning solution delivering module configured to deliver the cleaning solution to the object when the cleaning module performs a cleaning process on the object; a vibrating module configured to vibrate, move and drive the cleaning module to vibrate the object at a predetermined vibration frequency, so that the cleaning module performs vibration cleaning on the object through the cleaning solution; a cleaning tank configured to accommodate the object and the cleaning solution after cleaning the object; a transfer module configured to transfer the uncleaned object to the cleaning tank and transfer the cleaned object out of the cleaning tank; and a control module configured to control
(Continued)

working states of the cleaning solution delivering module, the vibrating module and the transfer module.

2 Claims, 3 Drawing Sheets

(51) Int. Cl.

| | |
|---|---|
| ***B08B 3/02*** | (2006.01) |
| ***B08B 3/04*** | (2006.01) |
| ***B08B 3/08*** | (2006.01) |

(56) References Cited

U.S. PATENT DOCUMENTS 6,271,149 B1 * 8/2001 Kondo .............. H01L 21/67028 430/127
6,365,531 B1 * 4/2002 Hayashi ............ H01L 21/02052 134/94.1
6,625,836 B1 * 9/2003 Lee ................... H01L 21/67046 15/77
6,733,596 B1 * 5/2004 Mikhaylichenko ....... B08B 1/04 134/6
2003/0166382 A1 * 9/2003 Ashjaee ................ B24B 37/345 451/54
2005/0087210 A1 4/2005 Yeo
2005/0199066 A1 * 9/2005 Wirth .................. H01L 21/6719 73/649
2008/0156360 A1 7/2008 Olgado et al.
2013/0239987 A1 * 9/2013 Kou .......................... B08B 3/12 134/1
2020/0164411 A1 * 5/2020 Chien ....................... B08B 3/08

FOREIGN PATENT DOCUMENTS

CN 103691714 A 4/2014
CN 203862612 U 10/2014
CN 105921431 A 9/2016
CN 206028241 U 3/2017
KR 2006058228 A * 5/2006 ................ H01J 9/38
WO WO-2018205397 A1 * 11/2018 ............... B08B 3/08

* cited by examiner

VIBRATION CLEANING DEVICE, METHOD AND SYSTEM

BACKGROUND

Technology Field

The embodiment of this disclosure relates to a cleaning device, and more particularly to a vibration cleaning device, method and system.

Description of Related Art

With the continuous development of science and technology, a variety of mechanical manufacturing automation devices come out one after another, gradually replace the traditional manual labor, and bring great convenience to people's production and life, wherein the production efficiency is increased, and the artificial cost is lowered.

However, because the existing cleaning device usually consists of a driving motor and a cleaning brush driven by the driving motor to move upward, downward, leftward and rightward to clean the object, it cannot effectively remove stubborn stains and the cleaning efficiency is lower.

SUMMARY

The embodiment of this disclosure provides a vibration cleaning device, method and system for the purpose of solving the following problems. Because the existing cleaning device usually consists of a driving motor and a cleaning brush driven by the driving motor to move upward, downward, leftward and rightward to clean the object, it cannot effectively remove stubborn stains and the cleaning efficiency is lower.

The disclosure provides a vibration cleaning device, which includes a cleaning module, a cleaning solution delivering module, a vibrating module, a cleaning tank, a transfer module, and a control module. The cleaning module is configured to clean an object through a cleaning solution, and the object includes a display panel. The cleaning solution delivering module is independently disposed on or disposed on the cleaning module and is configured to deliver the cleaning solution to the object when the cleaning module performs a cleaning process on the object. The vibrating module is mechanically connected to the cleaning module and is configured to vibrate, move and drive the cleaning module to vibrate the object at a predetermined vibration frequency, so that the cleaning module performs vibration cleaning on the object through the cleaning solution. The cleaning tank is configured to accommodate the to-be-cleaned object and the cleaning solution after cleaning the object. The transfer module is configured to transfer the to-be-cleaned object to the cleaning tank and transfer the cleaned object out of the cleaning tank. The control module is communicatively connected to the cleaning solution delivering module, the vibrating module and the transfer module, and is configured to control working states of the cleaning solution delivering module, the vibrating module and the transfer module.

In one embodiment, the vibration cleaning device further includes an ultrasonic wave generating module, which is disposed in the cleaning module, for emitting ultrasonic energy outwardly, so that bubbles in the cleaning solution delivered to the object are broken by impacting of the ultrasonic energy to generate shock waves for cleaning the object.

In one embodiment, the ultrasonic wave generating module is an ultrasonic wave generator having a multi-level adjustable frequency.

In one embodiment, an adjustable range of the multi-level adjustable frequency ranges from 10 KHZ to 200 KHZ.

In one embodiment, the ultrasonic wave generator includes a mildly cleaning level, a moderate cleaning level, a severe cleaning level and a strong cleaning level.

In one embodiment, a frequency of the mildly cleaning level is linearly adjustable in a range from 10 KHZ to 50 KHZ, a frequency of the moderate cleaning level is linearly adjustable in a range from 50 KHZ to 100 KHZ, a frequency of the severe cleaning level is linearly adjustable in a range from 100 KHZ to 150 KHZ, and a frequency of the strong cleaning level is linearly adjustable in a range from 150 KHZ to 200 KHZ.

In one embodiment, the cleaning module is a cleaning brush, a cleaning sponge block or a cleaning fiber cloth.

In one embodiment, the cleaning solution delivering module includes a liquid delivering unit and a spraying unit. The liquid delivering unit is independently disposed on or disposed on the cleaning module and is configured to deliver the cleaning solution. The spraying unit is disposed at a liquid outlet of the liquid delivering unit and is configured to spray the cleaning solution onto the object.

In one embodiment, the liquid delivering unit includes a liquid delivering tube, and the spraying unit includes a spraying head.

In one embodiment, the liquid delivering tube is a plastic tube, a metal tube or a synthetic material tube, and the spraying head is a shower head, a high pressure water gun, a spiral nozzle or an atomizing nozzle.

In one embodiment, the cleaning solution includes one or multiple ones of pure water, hydrogen peroxide, organic phosphoric acid, polycarboxylates, aromatic sulfonic acid and an amine-alkylene oxide adduct.

In one embodiment, the cleaning module is a cleaning brush, and the vibrating module is a vibration motor.

In one embodiment, the cleaning brush includes a brush head and a brush handle. The brush head directly contacts with the object to clean the object. The brush handle is connected to the brush head and the vibration motor, and is configured to vibrate and drive the brush head to vibrate under driving of the vibration motor to make the brush head perform the vibration cleaning on the object.

In one embodiment, the cleaning tank is a rectangular slot, a circular slot or a shaped slot.

In one embodiment, the transfer module includes a conveyor belt, a mechanical jaw, a transfer roller or a mechanical sliding track.

In one embodiment, the control module is a personal computer.

The present disclosure also provides a vibration cleaning method implemented according to the above-mentioned vibration cleaning device. The vibration cleaning method includes following steps executed by the control module: transferring the to-be-cleaned object to the cleaning tank, wherein the object comprises the display panel; delivering the cleaning solution to the object upon cleaning the object; performing the vibration cleaning on the object through the cleaning solution; and transferring the cleaned object out of the cleaning tank.

In one embodiment, the vibration cleaning method further includes: emitting the ultrasonic energy so that the bubbles in the cleaning solution delivered to the object are broken by impacting of the ultrasonic energy to generate the shock waves for cleaning the object.

The present disclosure further provides a vibration cleaning system implemented according to the above-mentioned vibration cleaning device. The vibration cleaning system is a software program system in the control module, which includes a transfer unit, a delivery unit, and a cleaning unit. The transfer unit is configured to transfer the to-be-cleaned object to the cleaning tank, and the object includes the display panel. The delivery unit is configured to deliver the cleaning solution to the object upon cleaning the object. The cleaning unit is configured to perform the vibration cleaning on the object through the cleaning solution. The transfer unit further transfers the cleaned object out of the cleaning tank.

In one embodiment, the vibration cleaning system further includes an ultrasonic wave emitting unit for emitting the ultrasonic energy, so that the bubbles in the cleaning solution delivered to the object are broken by impacting of the ultrasonic energy to generate shock waves for cleaning the object.

A vibration cleaning method is employed in the embodiment of this disclosure to clean the object, and it can effectively remove stubborn stains on the surface of the object and can effectively increase the cleaning efficiency.

BRIEF DESCRIPTION OF' THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

In order to provide the better understanding of this disclosure to those skilled in the art, the technical solution in the embodiments of this disclosure will be clearly described with reference to the accompanying drawings in the embodiments of this disclosure. Obviously, the described embodiment is the embodiment one portion of the module of this disclosure, rather than the embodiment of the entire module. All other embodiments obtained by those skilled in the art based on the embodiments of this disclosure without making creative work are deemed as falling within the scope of this application.

The specification and claims of this disclosure, and the terms "comprising" in the above-mentioned drawings and any variations thereof intend to cover the non-exclusive inclusion. For example, a process, method, system, product or device comprising a series of steps or units is not limited to the listed steps or units, but may further optionally comprise steps or units not listed, or alternatively comprise other steps or units inherent to these processes, methods, products or equipment. In addition, the terms "first," "second" and "third" are used to distinguish between different objects and not for describing a particular order.

Figure 1:
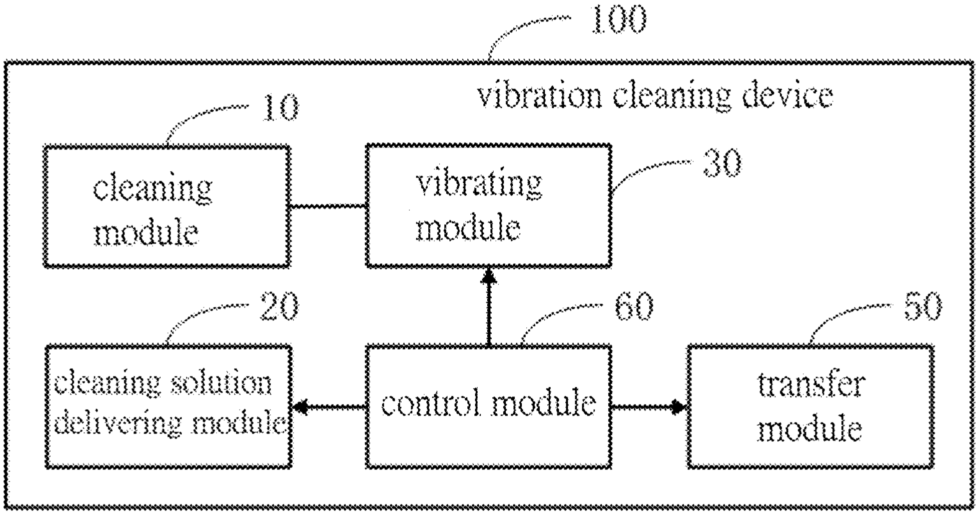
FIG. 1 is a block diagram showing a vibration cleaning device provided by an embodiment of this disclosure.

As shown in FIG. 1, an embodiment of this disclosure provides a vibration cleaning device 100. The vibration cleaning device 100 comprises a cleaning module 10, a cleaning solution delivering module 20, a vibrating module 30, a cleaning tank 40, a transfer module 50 and a control module 60.

The cleaning module 10 is for cleaning an object, comprising a display panel, through a cleaning solution.

In the specific application, the cleaning module may be a cleaning brush, a cleaning sponge block, a cleaning fiber cloth or the like. The object may further comprise precision instrument, such as a glass array substrate, a mechanical watch or the like, an industry machine tool or a tooth, which can be cleaned by way of vibration cleaning.

The cleaning solution delivering module 20 is independently disposed on or disposed on the cleaning module 10, and is for delivering the cleaning solution to the object when the cleaning module 10 performs a cleaning process on the object.

In the specific application, the cleaning solution may be any liquid substance capable of cleaning the object without causing a corrosive damage to the object.

In an embodiment, the cleaning solution comprises one or multiple ones of pure water, hydrogen peroxide, organic phosphoric acid, polycarboxylates, aromatic sulfonic acid and an amine-alkylene oxide adduct.

The vibrating module 30 mechanically connected to the cleaning module 10 is for vibrating, moving and driving the cleaning module 10 to vibrate at a predetermined vibration frequency, so that the cleaning module 10 performs the vibration cleaning on the object through the cleaning solution.

In the specific application, the predetermined vibration frequency may be configured according to the actual requirement. For example, the predetermined vibration frequency may be configured to be linearly adjustable or multi-level adjustable within a predetermined frequency range.

In the specific application, the vibrating module may be one of various types of vibration motors, such as a DC vibration motor, an AC vibration motor, a stepping vibration motor, a sensing vibration motor or the like, capable of implementing vibrating and moving.

The cleaning tank 40 (not shown in FIG. 1) is for accommodating the to-be-cleaned object and the cleaning solution after cleaning the object.

In the specific application, the cleaning tank may be configured to have any tank body capable of accommodating the placed object and the collection of the used cleaning fluid according to the actual requirement. For example, the tank body may have a rectangular slot, a circular slot, a shaped slot or the like. The cleaning tank may further comprise a transparent plastic or a glass cover to prevent the cleaning solution from splashing in the cleaning process.

The transfer module 50 is for transferring the to-be-cleaned object to the cleaning tank 40 and transferring the cleaned object out of the cleaning tank.

In the specific application, the transfer module can be any mechanical device capable of transferring the object. The mechanical device may be, for example, a conveyor belt, a mechanical jaw, a transfer roller, a mechanical sliding track or the like.

The control module 60 are communicatively connected to the cleaning solution delivering module 20, the vibrating module 30 and the transfer module 50 to control working states of the cleaning solution delivering module 20, the vibrating module 30 and the transfer module 50.

In the specific application, controlling the working state of each module specifically is to open and close each module, to control the vibration frequency of the vibrating module, to control the transfer path of the transfer module or the like to coordinate the works of the modules, so that the cleaning process of the object is proceeded smoothly.

In one embodiment, the control module can be any device having the control function, wherein the device may be, for example, a personal computer, a central processor (CPU), an application specific integrated circuit (ASIC) or the like.

In this embodiment, solid lines represent the mechanical connection relationships, and connection lines with the arrows represent communicative connections.

In this embodiment, a cleaning solution delivering module for delivering the cleaning solution is disposed on the vibration cleaning device to perform the vibration cleaning on the object while performing the auxiliary cleaning on the object through the cleaning solution, thereby effectively enhancing the cleaning effect and increasing the cleaning efficiency.

Figure 2:
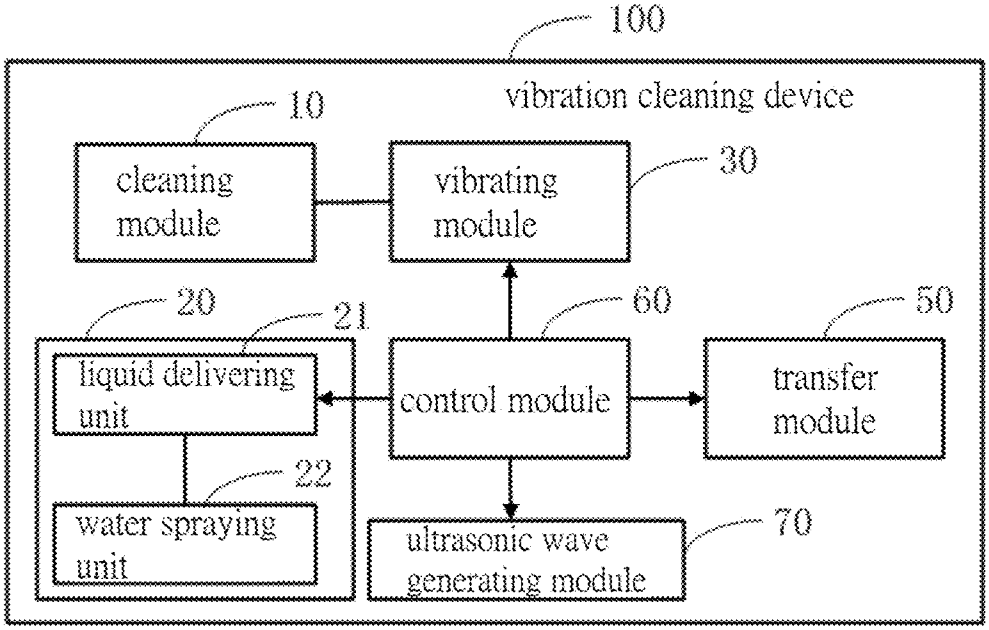
FIG. 2 is a block diagram showing a vibration cleaning device provided by another embodiment of this disclosure.

Referring to FIG. 2, in an embodiment of this disclosure, the vibration cleaning device 100 further comprises an ultrasonic wave generating module 70. The cleaning solution delivering module 20 comprises a liquid delivering unit 21 and a spraying unit 22.

The ultrasonic wave generating module 70 is provided in the cleaning module 10 and for emitting ultrasonic energy outwardly, so that bubbles in the cleaning solution delivered to the object are broken by impacting of the ultrasonic energy to generate shock waves for cleaning the object.

In one embodiment, the ultrasonic wave generating module is an ultrasonic wave generator having a multi-level adjustable frequency.

In some embodiments, the frequency adjusting level of the ultrasonic wave generator can be configured according to the requirement. For example, it may be configured to be a mildly cleaning level, a moderate cleaning level, a severe cleaning level, a strong cleaning level or the like.

In one embodiment, the frequency of ultrasonic wave generator may be configured to fall within any feasible frequency range, such as the range from 10 KHZ to 200 KHZ, according to the requirement.

In one embodiment, the ultrasonic wave generator comprises four frequency adjusting levels, which are the mildly cleaning, moderate cleaning, severe cleaning and strong cleaning levels, and the frequency of each frequency adjusting level is fixed, stepped adjustable or linearly adjustable. For example, a frequency of the mildly cleaning level is linearly adjustable in the range from 10 KHZ to 50 KHZ, a frequency of the moderate cleaning level is linearly adjustable in the range from 50 KHZ to 100 KHZ, a frequency of the severe cleaning level is linearly adjustable in the range from 100 KHZ to 150 KHZ, and a frequency of the strong cleaning level is linearly adjustable in the range from 150 KHZ to 200 KHZ.

The liquid delivering unit 21 is independently disposed on or disposed on the cleaning module 10 and for delivering the cleaning solution.

The spraying unit 22 is provided at a liquid outlet of the liquid delivering unit 21 and for spraying the cleaning solution onto the object.

In the specific application, the liquid delivering unit may specifically comprise a liquid delivering tube. The liquid delivering tube may be selected from any pipe capable of achieving the function of liquid delivering. For example, the liquid delivering tube may be made a plastic material or a metal material, or may be a soft tube or a hard tube made of synthetic material or the like. The spraying unit may specifically comprise a spraying head, and may be select from various types of spraying heads according to the requirement. For example, the spraying unit may be a shower head, a high pressure water gun, a spiral nozzle, an atomizing nozzle or the like.

In this embodiment, the solid lines represent the mechanical connection relationships, and connection lines with arrows represent communicative connections.

In this embodiment, an ultrasonic wave generating module generating the ultrasonic energy is provided on the vibration cleaning device, wherein the ultrasonic energy breaks the bubbles in cleaning solution to generate shock waves for cleaning the object, so that the cleaning efforts can be effectively strengthened and the cleaning efficiency can be thus enhanced.

Figure 3:
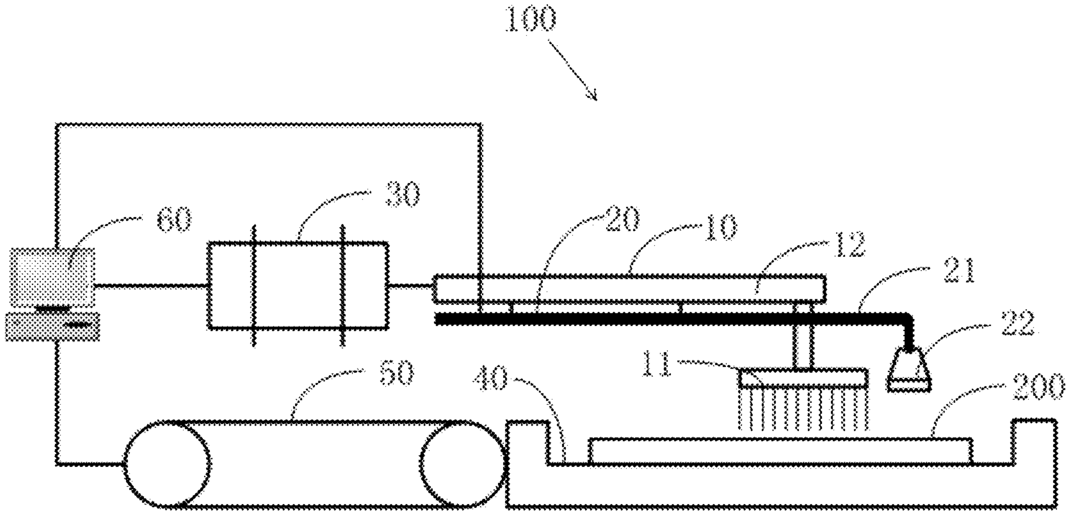
FIG. 3 is a mechanical schematic structure view showing a vibration cleaning device provided by an embodiment of this disclosure.

As shown in FIG. 3, an embodiment of this disclosure exemplarily depicts the mechanical structure of the vibration cleaning device 100 in the embodiment corresponding to FIG. 1. In this embodiment, the cleaning module 10 is a cleaning brush, and comprises a bristle-type brush head 11 and a rectangularly shaped brush handle 12. The brush head 11 is disposed on one end of the brush handle 12, and the other end of the brush handle 12 is mechanically connected to the vibrating module 30. The liquid delivering unit 21 is a liquid delivering tube, and the spraying unit 22 is a spraying head. The liquid delivering tube is fixed to one side of the brush handle 12 through fasteners. The spraying head is disposed at an outlet of the liquid delivering tube. The vibrating module 30 is a vibration motor. The cleaning tank 40 is a rectangular open slot. The transfer module 50 is a conveyor belt, which is disposed on one side of the cleaning tank 40. The control module 60 is a personal computer. Symbol 200 represents a to-be-cleaned object.

Figure 4:
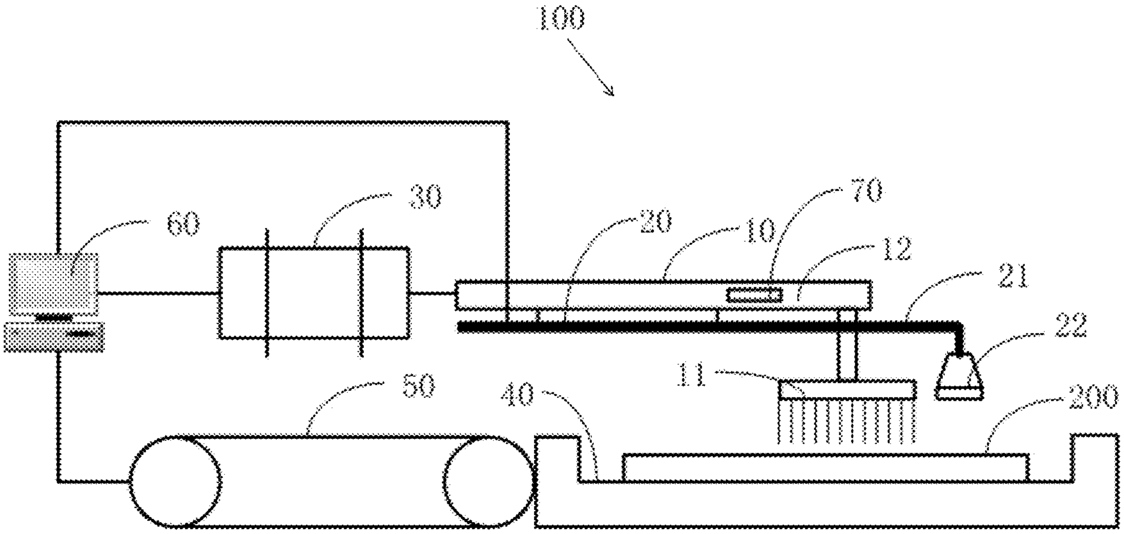
FIG. 4 is a mechanical schematic structure view showing a vibration cleaning device provided by another embodiment of this disclosure.

As shown in FIG. 4, an embodiment of this disclosure exemplarily depicts the mechanical structure of the vibration cleaning device 100 in the embodiment corresponding to FIG. 2, and is the improvement of the vibration cleaning device 100 shown in FIG. 3. In this embodiment, the vibration cleaning device 100 further comprises the ultrasonic wave generating module 70 disposed on the brush handle 12. In some implementations, the ultrasonic wave generating module can be disposed on the brush head or disposed on the liquid delivering unit and near one end of the liquid outlet.

Figure 5:
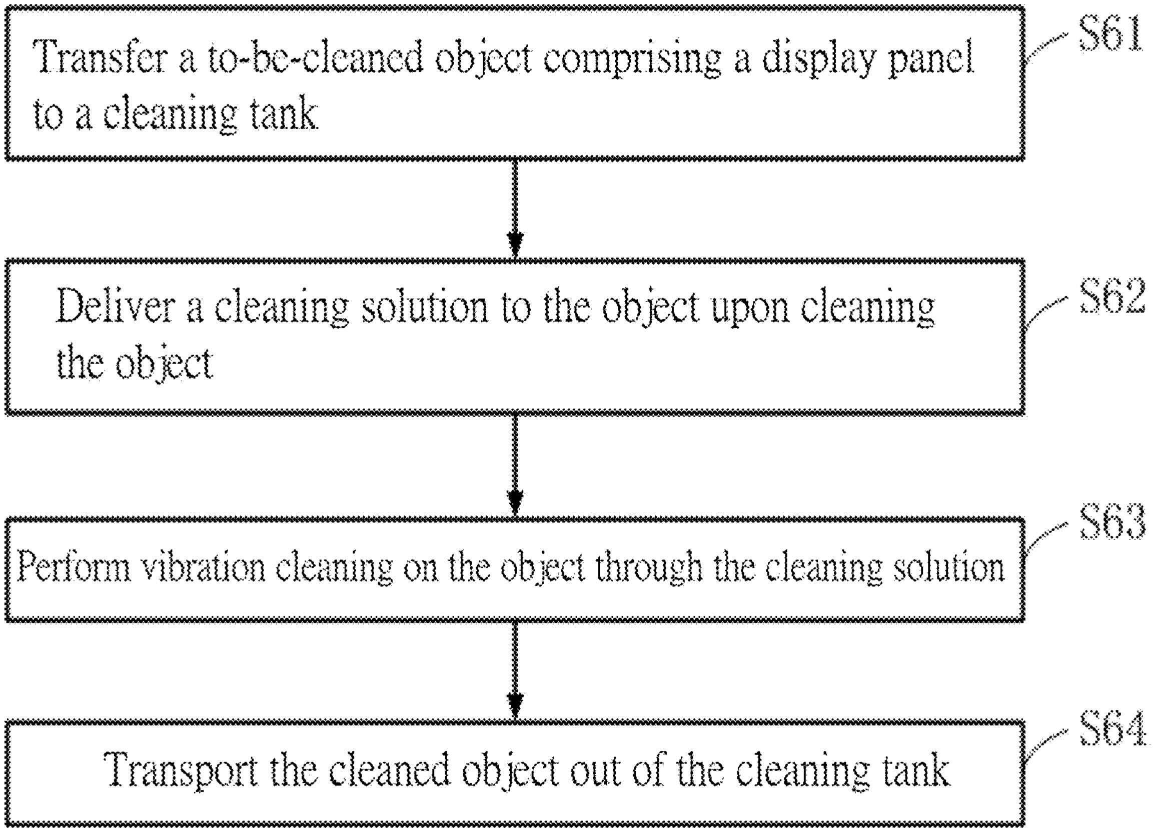
FIG. 5 is a schematic flow chart showing a vibration cleaning method provided by an embodiment of this disclosure.

As shown in FIG. 5, an embodiment of this disclosure further provides a vibration cleaning method is implemented according to the vibration cleaning device 100 as shown in FIG. 2 or 4. The method comprises the following steps performed by the control module 60.

In step S61, the to-be-cleaned object comprising the display panel is transferred to the cleaning tank.

In step S62, the cleaning solution is delivered to the object upon cleaning the object.

In step S63, the vibration cleaning is performed on the object through the cleaning solution.

In step S64, the cleaned object is transferred out of the cleaning tank.

In the specific application, the steps S61 and S64 are specifically implemented using the control module 60 to control the transfer module 50, the step S62 is specifically implemented using the control module 60 to control the cleaning solution delivering module 20, and the step S63 is specifically implemented using the control module 60 to control the vibrating module 30 and the cleaning module 10.

In one embodiment, the method further comprises the following steps.

In step S65, the ultrasonic energy is emitted so that the bubbles in the cleaning solution delivered to the object are broken by impacting of the ultrasonic energy to generate shock waves for cleaning the object.

In the specific application, the step S65 is specifically implemented using the control module 60 to control the ultrasonic wave generating module 70.

The embodiment of this disclosure further provides a vibration cleaning system implemented according to the vibration cleaning device shown in FIG. 2 or 4 to perform the steps in the embodiment of the method corresponding to FIG. 5. The system is a software program system in the control module, and the system comprises a transfer unit for transferring the to-be-cleaned object to the cleaning tank, the object comprising display panel; a delivery unit for delivering the cleaning solution to the object upon cleaning the object; and a cleaning unit for performing the vibration cleaning on the object through the cleaning solution. Wherein, the transfer unit further transfers the cleaned object out of the cleaning tank.

In one embodiment, the system further comprises: an ultrasonic wave emitting unit for emitting the ultrasonic energy so that the bubbles in the cleaning solution delivered to the object are broken by impacting of the ultrasonic energy to generate shock waves for cleaning the object.

The steps in the method of this disclosure may be sequentially adjusted, merged and deleted according to actual requirements.

The units in the system of this disclosure may be combined, divided and deleted according to actual requirements.

It will be understood by those of ordinary skill in the art that implementing all or part of the processes in the method of the embodiments described hereinabove may be accomplished by a computer program, which is for instructing the associated hardware and may be stored in a computer readable storage medium. The program may include a flow of the embodiment as described above when being executed. The storage medium may be a magnetic disk, a disc, a read-only memory (ROM), a random access memory (RAM) or the like.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A vibration cleaning method implemented according to a vibration cleaning device, wherein the vibration cleaning device comprises:

a cleaning module configured to clean an object through a cleaning solution;

a cleaning solution delivering module or disposed on the cleaning module and configured to deliver the cleaning solution to the object when the cleaning module performs a cleaning process on the object;

a vibrating module mechanically connected to the cleaning module and configured to vibrate the cleaning module at a predetermined vibration frequency, so that the cleaning module performs vibration cleaning on the object through the cleaning solution;

a cleaning tank configured to accommodate the object and the cleaning solution after cleaning the object;

a transfer module disposed on one side of the cleaning tank and configured to transfer the object to the cleaning tank and transfer the object out of the cleaning tank;

an ultrasonic wave generating module disposed in the cleaning module; and a control module communicatively connected to the cleaning solution delivering module, the vibrating module and the transfer module and configured to control working states of the cleaning solution delivering module, the vibrating module and the transfer module;

wherein the cleaning solution delivering module comprises:

a liquid delivering unit disposed on the cleaning module and configured to deliver the cleaning solution; and a spraying unit disposed at a liquid outlet of the liquid delivering unit and configured to spray the cleaning solution onto the object, wherein the vibration cleaning method comprises following steps executed by the control module:

transferring the object to the cleaning tank by the transfer module, wherein the object comprises a display panel;

cleaning the object by delivering the cleaning solution onto the object by the cleaning solution delivering module, wherein the liquid delivering unit delivers the cleaning solution and the spraying unit sprays the cleaning solution onto the object;

vibrating the cleaning module at the predetermined vibration frequency by the vibrating module to perform the vibration cleaning on the object through the cleaning solution; and transferring the object out of the cleaning tank by the transfer module.

2. The vibration cleaning method according to claim 1, further comprising:

emitting ultrasonic energy outwardly by the ultrasonic wave generating module, so that bubbles in the cleaning solution delivered to the object are broken by impacting of the ultrasonic energy to generate shock waves for cleaning the object.

* * * * *